(12) United States Patent
Phatak et al.

(10) Patent No.: US 9,761,800 B2
(45) Date of Patent: Sep. 12, 2017

(54) METHOD FOR REDUCING FORMING VOLTAGE IN RESISTIVE RANDOM ACCESS MEMORY

(71) Applicant: Intermolecular, Inc., San Jose, CA (US)

(72) Inventors: Prashant B. Phatak, San Jose, CA (US); Ronald J. Kuse, San Diego, CA (US); Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 578 days.

(21) Appl. No.: 14/312,628

(22) Filed: Jun. 23, 2014

(65) Prior Publication Data

US 2014/0302659 A1    Oct. 9, 2014

Related U.S. Application Data

(63) Continuation of application No. 13/673,504, filed on Nov. 9, 2012, which is a continuation-in-part of application No. 13/189,065, filed on Oct. 6, 2011, now abandoned.

(51) Int. Cl.
*H01L 21/00* (2006.01)
*H01L 45/00* (2006.01)
*H01L 27/24* (2006.01)

(52) U.S. Cl.
CPC .......... *H01L 45/1616* (2013.01); *H01L 45/04* (2013.01); *H01L 45/08* (2013.01); *H01L 45/1233* (2013.01); *H01L 45/146* (2013.01); *H01L 45/1641* (2013.01); *H01L 27/2463* (2013.01)

(58) Field of Classification Search
CPC ....................................................... H01L 21/00
See application file for complete search history.

(56) References Cited

U.S. PATENT DOCUMENTS

2013/0043451 A1* 2/2013 Lee ..................... G11C 11/5685
257/2

FOREIGN PATENT DOCUMENTS

CN    WO 2012162867 A1 * 12/2012    ......... G11C 13/0007

* cited by examiner

*Primary Examiner* — Marvin Payen

(57) ABSTRACT

Methods for producing RRAM resistive switching elements having reduced forming voltage include preventing formation of interfacial layers, and creating electronic defects in a dielectric film. Suppressing interfacial layers in an electrode reduces forming voltage. Electronic defects in a dielectric film foster formation of conductive pathways.

16 Claims, 15 Drawing Sheets

US 9,761,800 B2

METHOD FOR REDUCING FORMING VOLTAGE IN RESISTIVE RANDOM ACCESS MEMORY

CROSS-REFERENCE TO RELATED APPLICATIONS

This is a Continuation Application of U.S. patent application Ser. No. 13/673,504, filed on Nov. 9, 2012, which is a Continuation-in-Part of U.S. patent application Ser. No. 13/189,065, filed on Oct. 6, 2011, each of which is incorporated herein by reference in its entirety for all purposes.

FIELD OF THE INVENTION

The present invention relates generally to semiconductor memories and more particularly a method for producing a resistive switching memory with a reduced forming voltage.

BACKGROUND OF THE INVENTION

All but the simplest electronic devices utilize nonvolatile memories. When an electronic device must retain information during and after being placed in an unpowered state, nonvolatile memories must be provided. Several types of nonvolatile memories are known in the art. Nonvolatile memories may be portable, auxiliary, or integrated in a circuit or as components in both general and embedded computer systems. Most generally, nonvolatile memories are found in digital cameras, cellular telephones, music players, and as the key component in portable memory devices such as USB based flash drives.

Nonvolatile memory is often formed using electrically-erasable programmable read only memory (EPROM) technology. EPROM, also known as flash memory, uses an architecture that is inadequate in its access, erase and write times for the rapidly increasing operational speed requirements and rapidly decreasing size requirements of electronic devices. What is needed is memory architecture with faster access, erase and write times scalable to smaller devices. Volatile memories (such as Random Access Memory (RAM)) can potentially be replaced by nonvolatile memories if the speeds of nonvolatile memories are increased to meet the requirements for RAM and other applications currently using volatile memories. Resistive switching memories may provide an alternative to flash memories.

Resistive switching nonvolatile memories are formed of arrays of resistive switching elements where each element has two or more stable resistive states. Bi-stable resistive switching elements have two stable states. The application of an electric field having a particular voltage or current will result in a desired element resistance. Voltage pulses are typically used to switch the memory element from one resistance state to the other.

Resistive switching elements use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form one or more conductive pathways in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage.

Resistive switching memory uses peripheral transistors to control the application of voltage to the resistive switching material, and thereby alter the resistive state of the resistive switching material. Resistive switching memory with a high forming voltage requires high voltage peripheral transistors. High voltage peripheral transistors add to the cost and complexity of the resistive switching memory. Consequently, a resistive switching memory with reduced forming voltage is desired.

BRIEF DESCRIPTION OF THE DRAWINGS

The numerous objects and advantages of the present invention may be better understood by those skilled in the art by reference to the accompanying figures in which.

DETAILED DESCRIPTION

Figure 1:
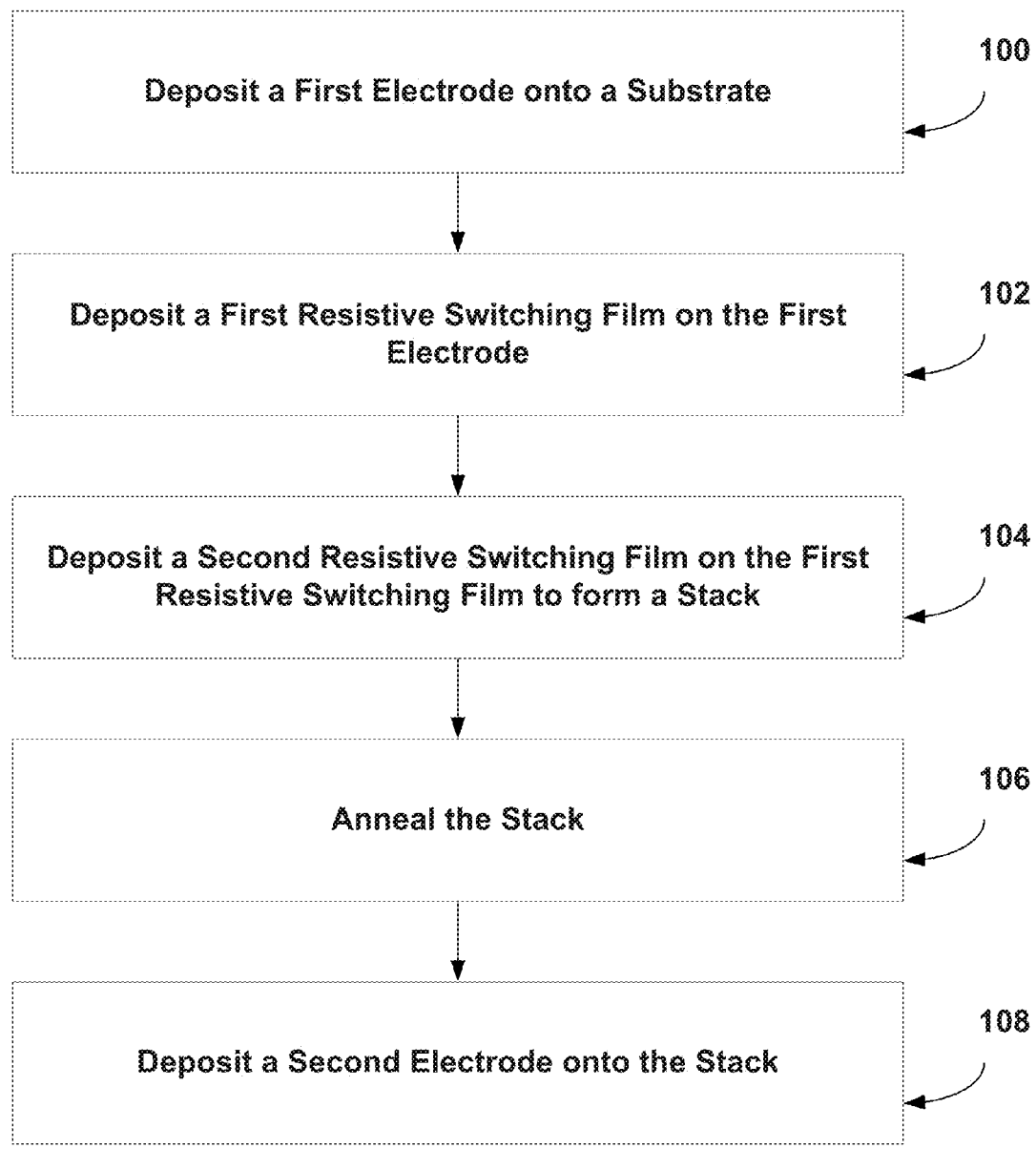
FIG. 1 shows a flowchart depicting one embodiment of a method for producing resistive switching elements.

Provided are methods for producing Resistive Random Access Memory (RRAM) resistive switching elements having reduced forming voltage. The forming voltage is reduced by preventing formation of interfacial layers during the manufacture of resistive switching elements. The first method for preventing interfacial layer formation involves depositing the dielectric material at a low temperature. The second method for preventing interfacial layer formation involves adding a thin film to the first electrode. The third method for preventing interfacial layer formation involves converting the first electrode to a conducting silicide, which will not form interfacial layers. The forming voltage may be also reduced by creating electronic defects in the dielectric material. For example, electronic defects may be created by annealing the dielectric material in an inert atmosphere to add oxygen deficiencies. The dielectric material may be annealed to modulate defect densities.

RRAM resistive switching elements having reduced forming voltage are useful because RRAM resistive switching elements with reduced forming voltage require lower voltage peripheral transistors. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

RRAM Cell Formation

A RRAM cell includes two electrodes with a resistive switching element placed between the two electrodes. In RRAM, forming is a process by which the resistive switching element in the RRAM cell is put into its low resistance state for the first time. The process is performed by applying a voltage, called the forming voltage, across the two electrodes of a resistive switching element to form one or more conductive pathways in the resistive switching element. Conductive pathways formed during the forming process reduce the resistance of the resistive switching element. Once the forming process is complete, a certain voltage, called the reset voltage, may be applied across the two electrodes to break the conductive pathways, thereby increasing the resistance of the resistive switching element. Another voltage, called the set voltage, may be applied across the two electrodes to reform the conductive pathways, thereby reducing the resistance of the resistive switching element. A typical forming voltage for a RRAM resistive switching element is about seven volts, while the set voltage and reset voltage are typically lower than the forming voltage.

A RRAM cell may be regarded as storing a logical bit; where the resistive switching element has increased resistance, the RRAM cell may be regarded as storing a "0" bit; where the resistive switching element has reduced resistance, the RRAM cell may be regarded as storing a "1" bit. A circuitry may be used to read the resistive state of the resistive switching element by applying a read voltage to the two electrodes and measuring the corresponding current through the resistive switching element. If the current through the resistive switching element is greater than some predetermined baseline current, the resistive switching element is deemed to be in a reduced resistance state, and therefore the RRAM cell is storing a logical "1." On the other hand, if the current through the resistive switching element is less than some predetermined baseline current, then the resistive switching element is deemed to be in an increased resistance state, and therefore the RRAM cell is storing a logical "0." The read voltage is typically some predetermined voltage that is less than the set voltage, the reset voltage, and the forming voltage. The read voltage must be sufficient to determine the resistive state of the resistive switching element but must not alter the conductive pathways of the resistive switching element.

Forming voltage, set voltage, reset voltage and read voltage, and the increased resistive state and reduced resistive state, are all functions of the electrodes used in the resistive switching element, a type of resistive switching material used in the resistive switching element, and the processes performed on those electrodes and resistive switching material such as doping and annealing. Manufacturers desire RRAM with discrete, well defined increased and reduced resistive states, and reduced forming voltage.

Reducing Forming Voltage by Depositing a Dielectric Material at a Low Temperature as in FIG. 1

Resistive switching elements in RRAM devices may be manufactured by depositing at least one layer of a resistive switching material, such as a dielectric material, onto a first (or bottom) electrode. This layer may be deposited using atomic layer deposition (ALD), chemical vapor deposition (CVD), physical vapor deposition (PVD) or some other process. A top electrode or second electrode may be formed over this dielectric material layer. Interfacial layers can develop where one layer meets another during this overall processing.

In some RRAM implementations, interfacial layers in the resistive switching element can cause an increase in the forming voltage. For example, in resistive switching elements that utilize polycrystalline silicon (poly-Si) as an electrode, an interfacial layer of $SiO_x$ forms when a dielectric material such as $HfO_x$ is deposited onto the poly-Si layer. The interfacial layer of $SiO_x$ hinders effective electron injection into the dielectric material. Electron injection enables conductive pathways to form.

Referring to FIG. 1, a method for forming a resistive switching element is shown. A first electrode is deposited during operation 100 onto a substrate. The first electrode may include a material suitable for use in the RRAM cell. One such example includes poly-Si. A first resistive switching film is then deposited during operation 102 onto the first electrode. This operation may involve ALD or other suitable technique. The first resistive switching film may be formed from a suitable dielectric, such as Hafnium Oxide ($HfO_x$). The deposition is performed at temperatures low enough to suppress the formation of an interfacial layer of silicon oxide or $SiO_x$, such as below 200° C. As stated above, an interfacial layer of $SiO_x$ raises the forming voltage of the resistive switching element, so suppression of that interfacial layer is desirable and generally results in lower forming voltages. A second resistive switching film is then deposited during operation 104 onto the first resistive switching film. The second resistive switching film is a dielectric material that enhances the function of the first resistive switching film by lowering the forming voltage of the resulting resistive switching element. It works in conjunction with the first resistive switching film. The second resistive switching film may be made from materials, such as titanium oxide (or $TiO_x$). In some embodiments, the second resistive switching film is deposited using ALD. A combination of the first and second resistive switching films produces an insulating layer (i.e., a stack) that forms conductive pathways upon application of an appropriate voltage, maintains the conductive pathways when such voltage is no longer present. The stack allows such pathways to be reset upon application of an appropriate voltage. The first electrode and the stack are then annealed during operation 106. Annealing modifies the bulk properties of the stack, causing the first and second resistive switching layer films to form a region where the first and second films have diffused into each other. This diffused or doped region of the first and second films has electrical properties that facilitate the formation of conductive pathways. A second electrode is then deposited 108 onto the second film. The second electrode may be made from a material suitable for use in a resistive switching element. One example includes titanium nitride (TiN).

Figure 5:
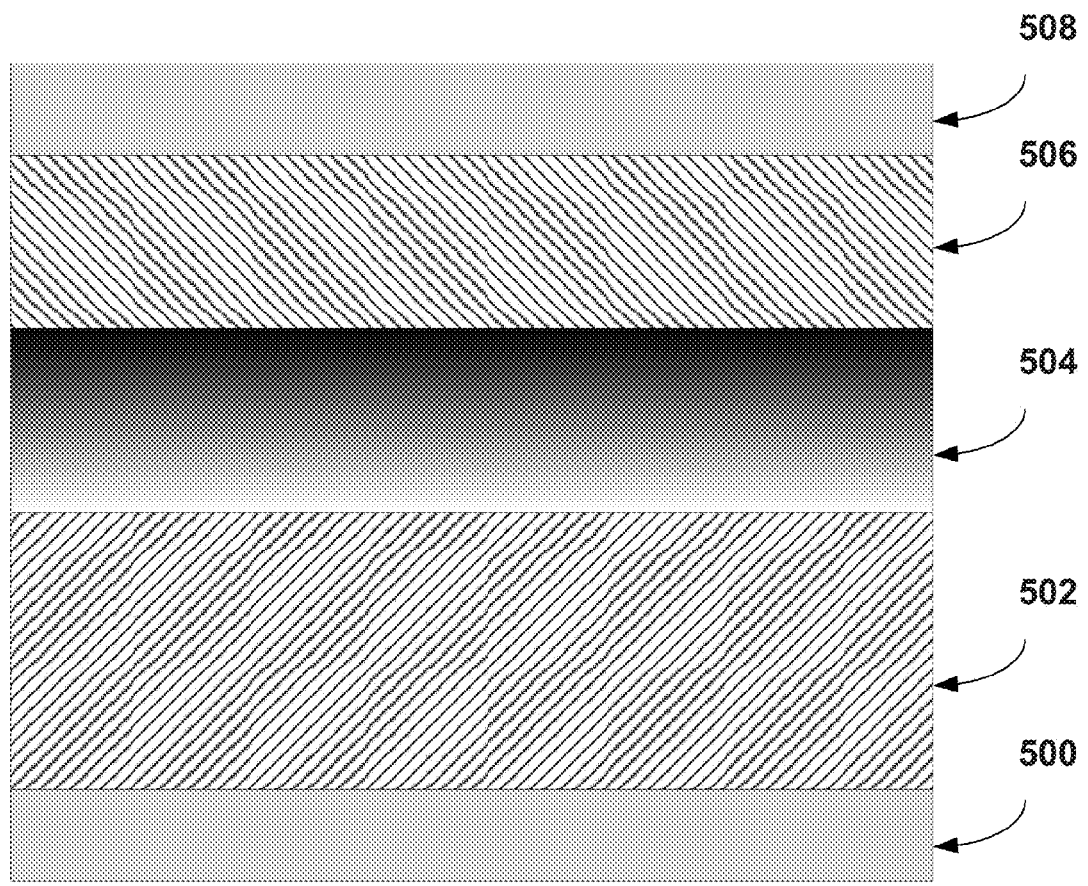
FIG. 5 shows a cross-sectional side view of a resistive switching element produced by embodiments such as that depicted in FIG. 1 and FIG. 3.

Referring to FIG. 5, a resistive switching element produced by method 100 may include a first electrode 500 made of poly-Si, which is covered by a film 502 made of hafnium oxide. Whereas using conventional processes for depositing a hafnium oxide film using, e.g., ALD would produce an interfacial layer of $SiO_x$ on polysilicon, the method described above suppresses growth of $SiO_x$. A titanium oxide film 506 covers the hafnium oxide film. A diffusion layer 504 is formed between the two films 502 and 506 as described above. Diffusion layer 504 enhances the function of the resistive switching element. Finally, a TiN electrode 508 covers the $TiO_x$ film 506.

Figure 2:
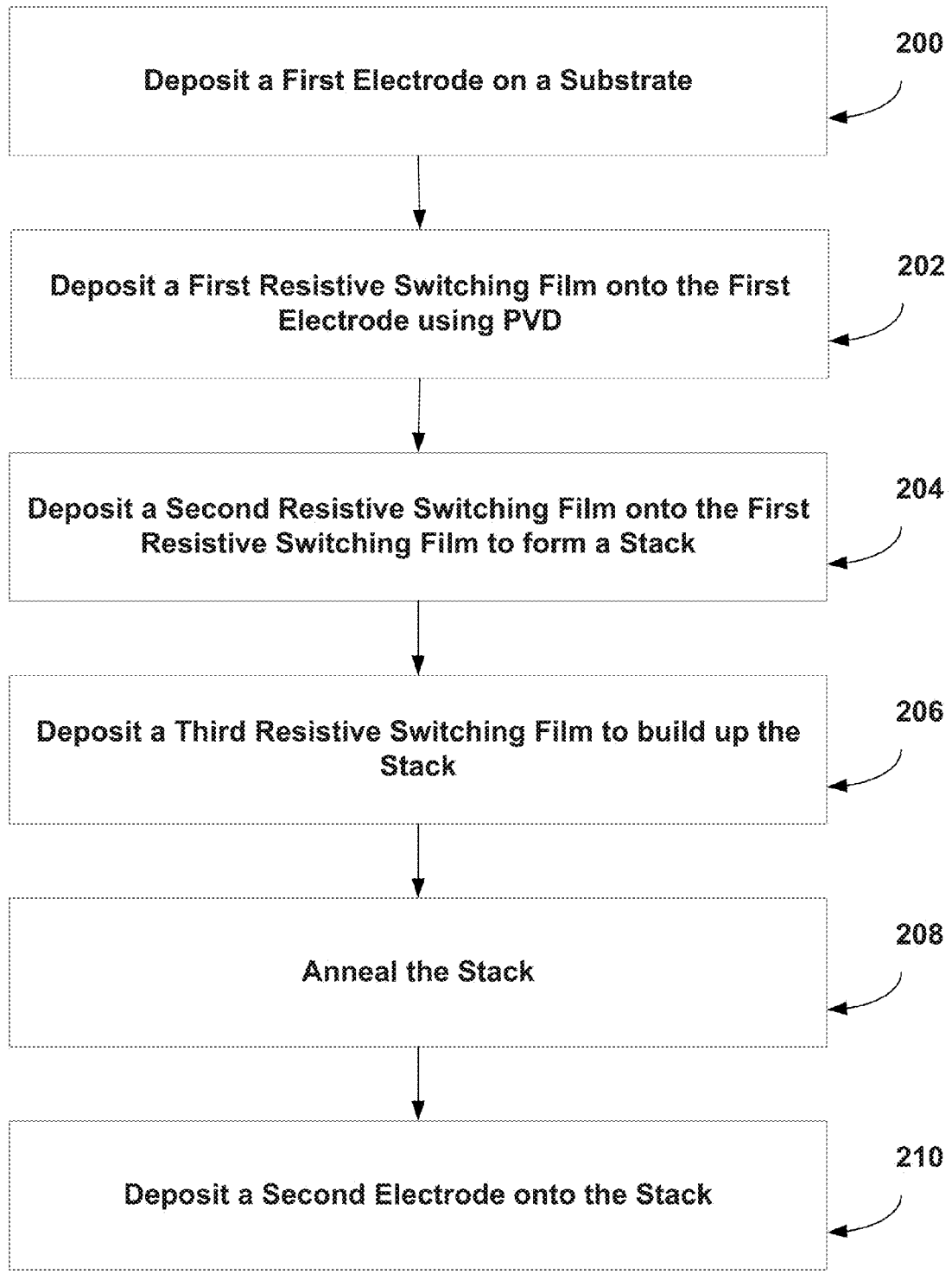
FIG. 2 shows a flowchart depicting another embodiment of a method for producing resistive switching elements.

Reducing Forming Voltage by Depositing a Thin Film on the First Electrode as in FIG. 2

FIG. 2 depicts another example for forming a resistive switching element. A first electrode is deposited during operation 200 onto a substrate. The first electrode is made from a material suitable for use in a resistive switching element. Some examples include poly-Si. A first resistive switching layer film is then deposited during operation 202 onto the first electrode by, e.g., physical vapor deposition (PVD). The first resistive switching film is made from a material suitable for protecting the first electrode from oxidation, such as $HfO_x$, considering the specific deposition conditions. Specifically, $HfO_x$ deposited by PVD at certain conditions prevents formation of a $SiO_x$ interfacial layer and acts as a barrier layer during, e.g., subsequent ALD deposition. As such, the structure formed in accordance to this example has a reduced forming voltage of the resulting resistive switching element. A second resistive switching film is then deposited during operation 204 onto the first resistive switching film. The second resistive switching film may be deposited by ALD using conventional temperatures, e.g., greater than 200° C. The second resistive switching film is a dielectric suitable for use in a resistive switching element, such as Hafnium Oxide ($HfO_x$). A third resistive switching film is then deposited during operation 206 on the second resistive switching film 206. The third film is made from a dielectric material that enhances the function of the second resistive switching film by lowering the forming voltage of the resulting resistive switching element and works in conjunction with the second film. The third resistive switching film may be titanium oxide ($TiO_x$) and may be deposited by ALD. A combination of the first resistive switching layer, the second resistive switching layer, and the third resistive switching layer is referred to as a stack that forms conductive pathways upon application of an appropriate voltage, maintains the conductive pathways when such voltage is no longer present, and which allows such pathways to be reset upon application of an appropriate voltage. The stack is then annealed during operation 208 to form a diffused layer of the second and third resistive switching films. A second electrode is then deposited during operation 210 onto the stack. The second electrode is made from a material suitable for a resistive switching element. One example include titanium nitride (TiN).

Figure 6:
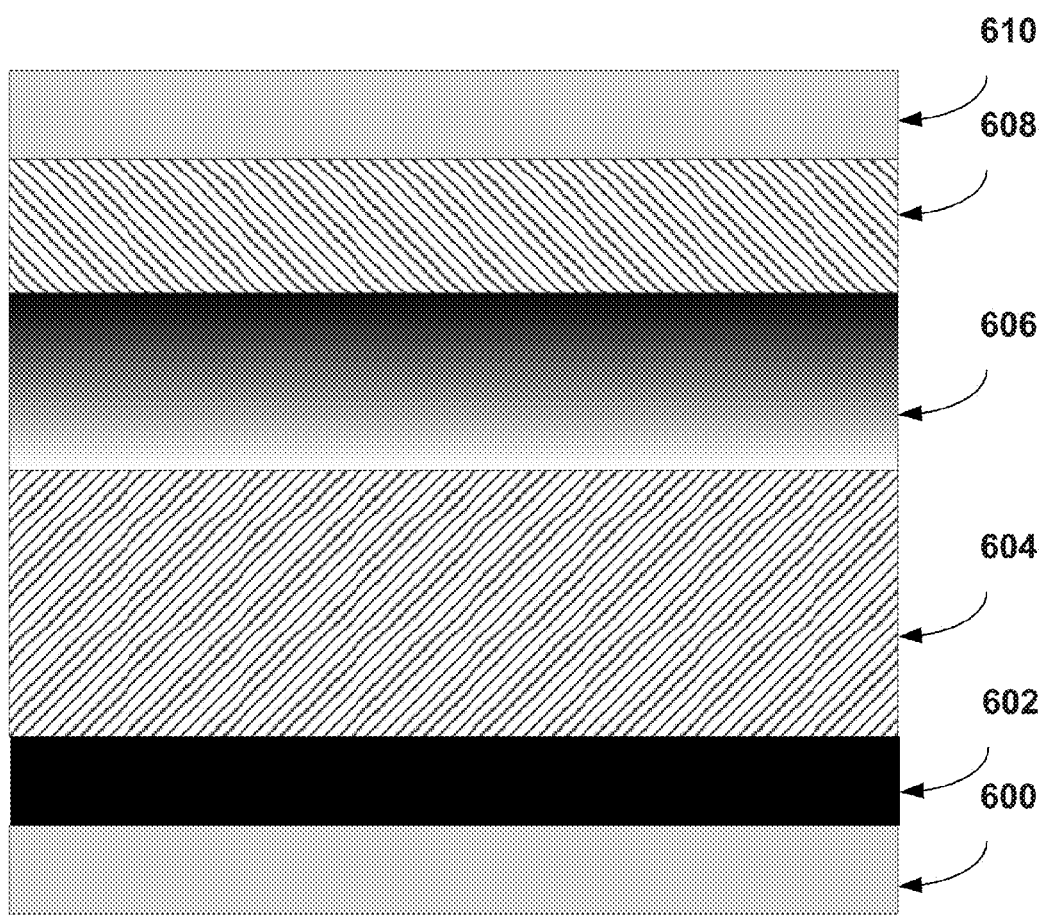
FIG. 6 shows a cross-sectional side view of a resistive switching element produced by embodiments such as that depicted in FIG. 2.

Referring to FIG. 6, a resistive switching element produced by method 200 is shown. The resistive switching element has a first electrode 600 made of, e.g., polysilicon, covered by a first resistive switching film 602, e.g., hafnium oxide deposited by PVD to protect the first electrode film from oxidation and thereby to prevent formation of a $SiO_x$ interfacial layer. The first resistive switching film 602 is covered by a second resistive switching film 604, e.g., a hafnium oxide film deposited by ALD. A third resistive switching layer 608 (e.g., titanium oxide) covers second resistive switching film 604. A diffusion layer 606 may be formed at the interface of second resistive switching film 604 and third resistive switching layer 608. Diffusion layer enhances the function of the overall resistive switching element. Finally, an electrode 610 (e.g., made from titanium nitride) covers the third resistive switching film 608.

Figure 3:
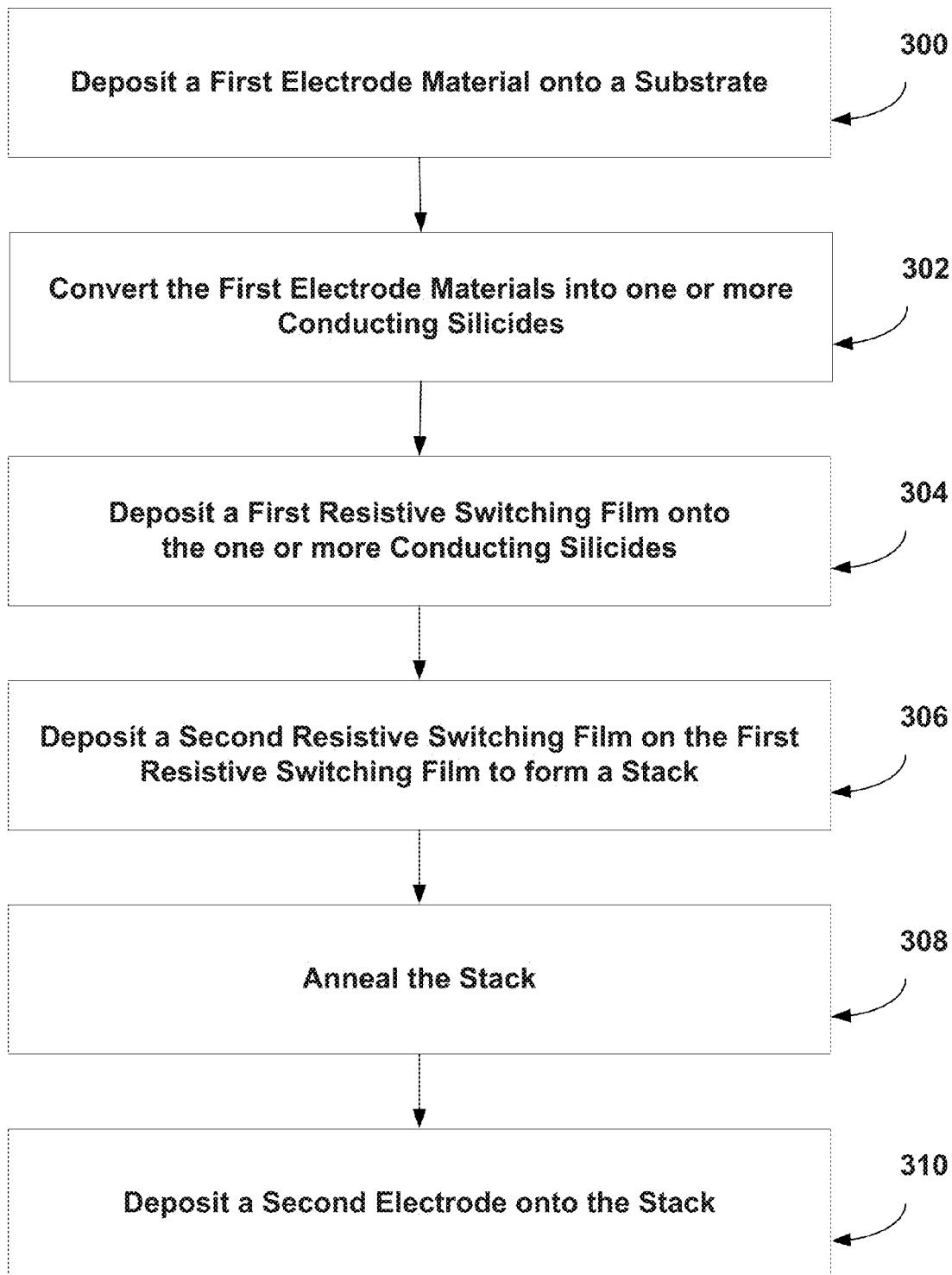
FIG. 3 shows a flowchart depicting another embodiment of a method for producing resistive switching elements.

Reducing Forming Voltage by Converting the First Electrode to a Conducting Silicide as in FIG. 3

Another example of forming a resistive switching element is shown in FIG. 3. A first electrode material is deposited during operation 300 onto a substrate. The first electrode material is suitable for use in a resistive switching element, e.g., poly-Si. This material is then converted during operation 302 to a conducting silicide. This operation may involve depositing an appropriate metal, such as Ti, Ni, Co, Pd or Pt, using suitable deposition techniques, such as ALD, CVD or PVD, and then annealing the electrode. Conducting silicides should not form interfacial layers during subsequent deposition process. Therefore, converting the first electrode material into one or more conducting silicides will result in a RRAM cell with a lower forming voltage than in a conventional cell in which a polysilicon electrode is not converted into silicides, but otherwise process in accordance to the method presented in FIG. 3. A first resistive switching film is then deposited during operation 304 onto the first electrode including one or more conducting silicides. This deposition may be performed using ALD. The first resistive switching film may be made from a dielectric suitable for use in a resistive switching element, e.g., Hafnium Oxide ($HfO_x$). A second resistive switching film is then deposited during operation 306 onto the first resistive switching film. The second film may be made from a dielectric material that enhances the function of the first film by lowering the forming voltage of the overall resulting resistive switching element. The second film works in conjunction with the first film. The second film may be made from titanium oxide ($TiO_x$) and may be deposited by ALD. The overall resulting resistive switching element is configured to form conductive pathways upon application of an appropriate voltage, to maintain said conductive pathways when such voltage is no longer present, and to reset said conductive pathways upon application of an appropriate voltage. The stack including the first and second films may be annealed during operation 308 to form a diffused layer at the interface of the two films. The process then proceeds with depositing a second electrode onto the stack during operation 310. The second electrode may include titanium nitride.

Figure 4:
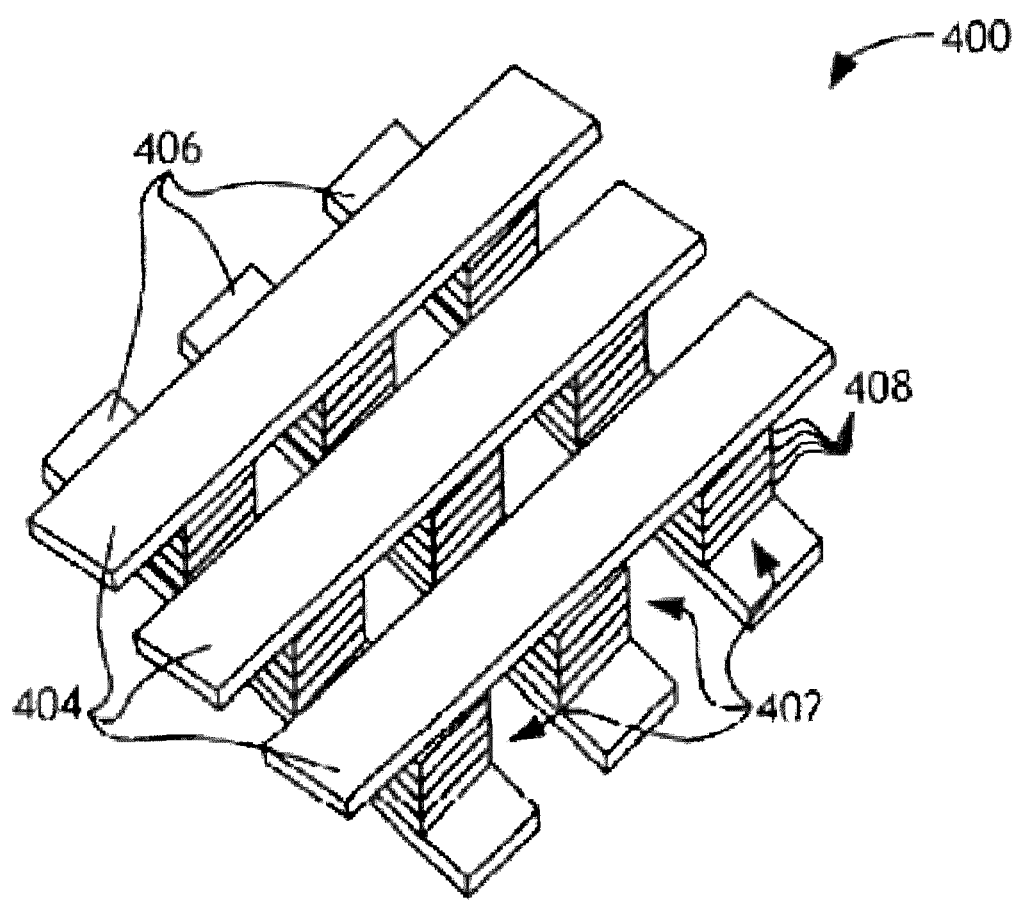
FIG. 4 shows a perspective view of an array of resistive switching elements formed by embodiments such as those depicted in FIG. 1, FIG. 2 and FIG. 3.

Referring to FIG. 4, a resistive switching element 402 produced by any method described herein would generally by used in an array of RRAM cells 400. Each resistive switching element 402 in the array or RRAM cells 400 is connected to a first signal line 404 and a second signal line 406 such that the first signal line 404 would be operatively connected to a first electrode in the resistive switching element and the second signal line would operatively connected to a second electrode in the resistive switching element. With appropriate first and second signal line configuration, each individual resistive switching element 402 is separately addressable.

Figure 7:
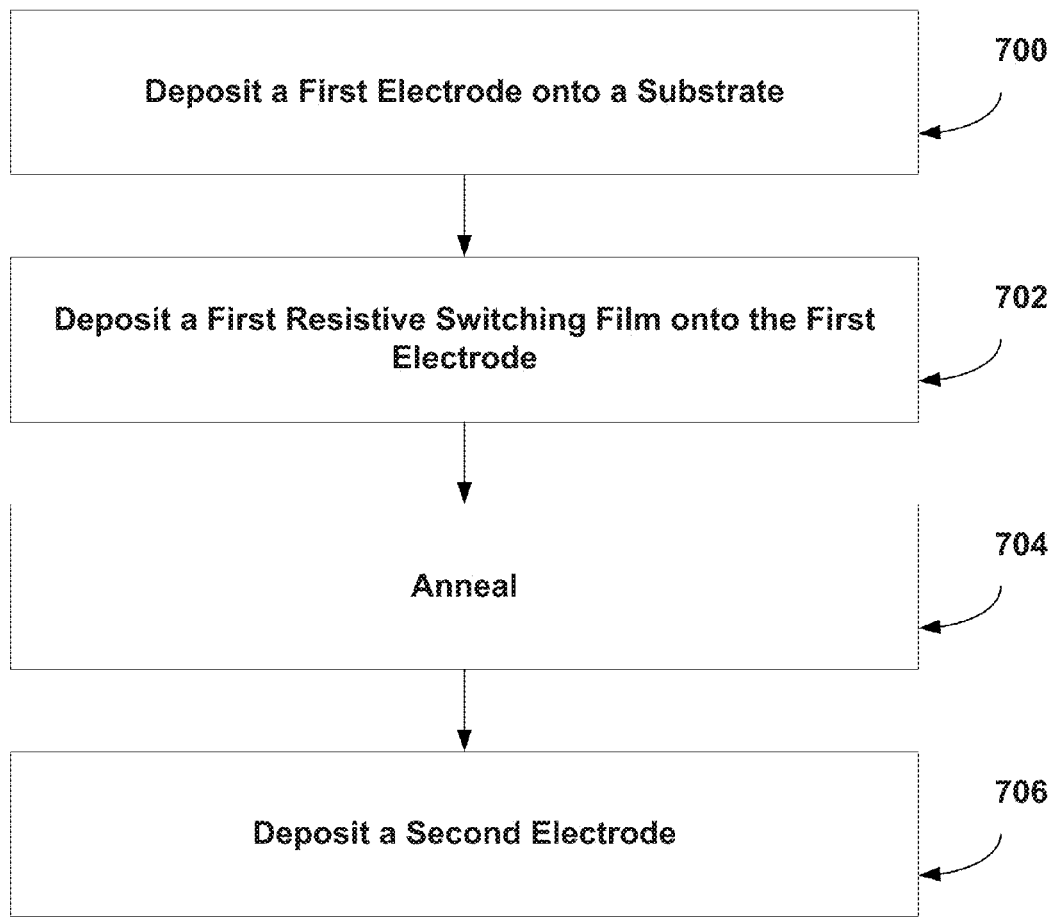
FIG. 7 shows a flowchart depicting another embodiment of a method for producing resistive switching elements.

Reducing Forming Voltage by Creating Oxygen Deficiencies in Metal Oxides as in FIG. 7

Dielectric material layers in resistive switching elements may include metal oxides. Metal-rich (that may be also referred to as oxygen-deficient) metal oxides demonstrate reduced forming voltage in resistive switching elements compared to oxygen rich dielectric layers, e.g., stoichiometric oxides. Metal oxide films deposited in accordance to certain embodiments may be metal rich.

Figure 8:
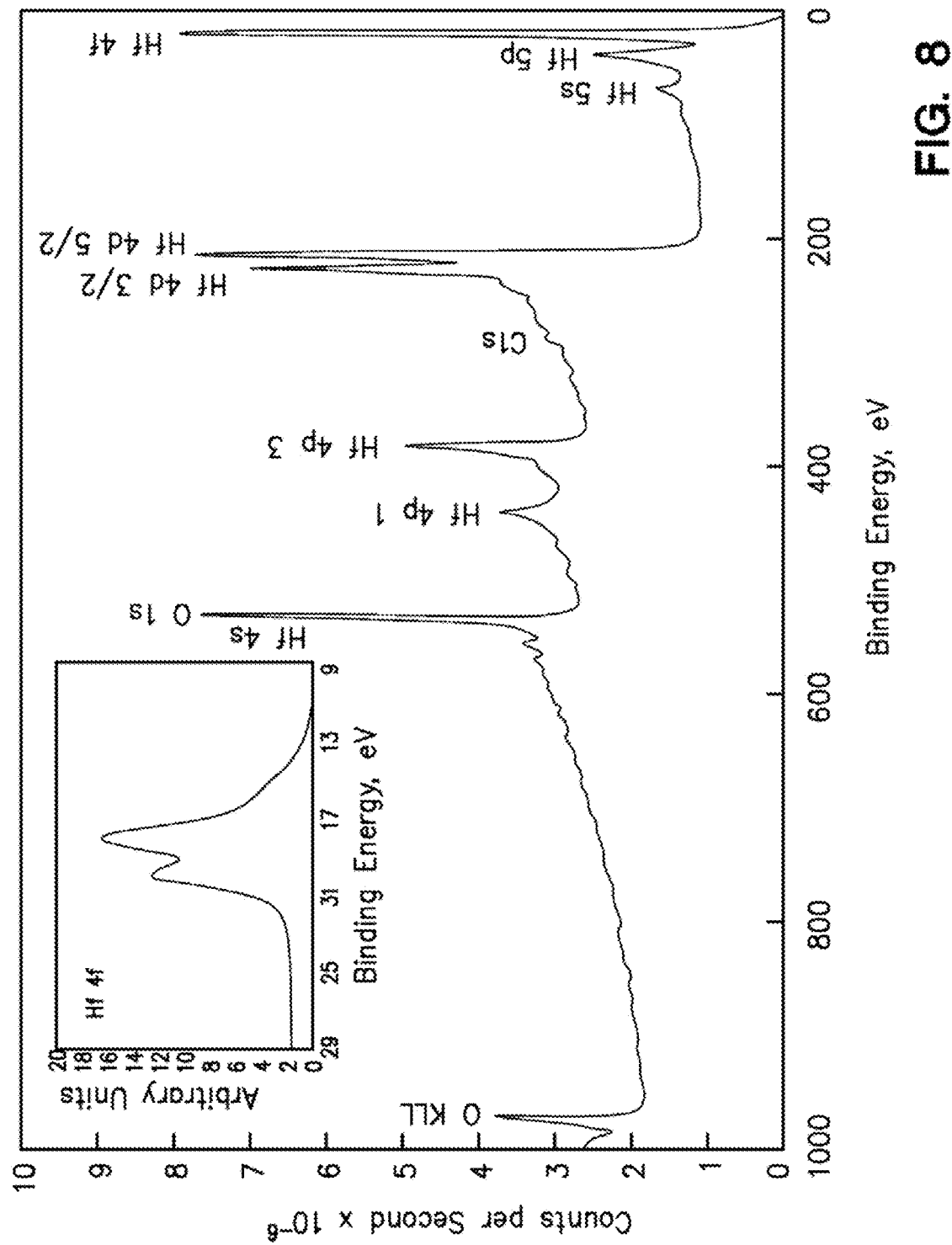
FIG. 8 shows a chart depicting an x-ray photoelectron spectrogram of a film produced by the method set forth in FIG. 7.

Referring to FIG. 7, a method for forming a resistive switching element is shown. A first electrode is deposited during operation 700 onto a substrate. The first electrode may be made from a material suitable for use in a resistive switching element. One example of such materials include poly-Si. A first resistive switching film is then deposited during operation 702 onto the first electrode using, e.g., ALD. Conventional ALD deposition may involve flowing some deposition fluid to be adsorbed on the first electrode and then converted into the electrode materials. For example, when depositing $HfO_x$, an ALD device flows tetrakis (dimethylamino) hafnium (TDMAH) may be flown into the chamber and then (after being adsorbed on the surface of the first electrode) be oxidized with water vapor. The hafnium containing precursor temperature may be between 30° C. and 100 C., while the water vapor source is maintained at room temperature. This conventional method results in an oxygen rich $HfO_x$ film. According to the present method, an oxidizer used in the ALD process (water vapor in the example above) is maintained below room temperature and TDMAH is maintained at between 40° C. and 50° C. In some embodiments, the oxidizer is flown at a temperature of between 2° C. and 5° C. The lower temperature reduces water vapor pressure, thereby controlling the chemical potential of the water vapor independent of carrier gas flow rate. The first electrode and first film are then annealed during 704 to produce an oxygen deficient metal oxide layer Annealing occurs in an atmosphere of 4% hydrogen and 94% argon at a temperature of 750 C. A second electrode is then deposited during operation 706 onto the first film. The second electrode is a material suitable for use in a resistive switching element such as TiN. Referring to FIG. 8, using x-ray photoelectron spectroscopy (XPS), a $HfO_x$ film produced by the present method has an oxygen to hafnium ratio of 1.7.

Figure 9:
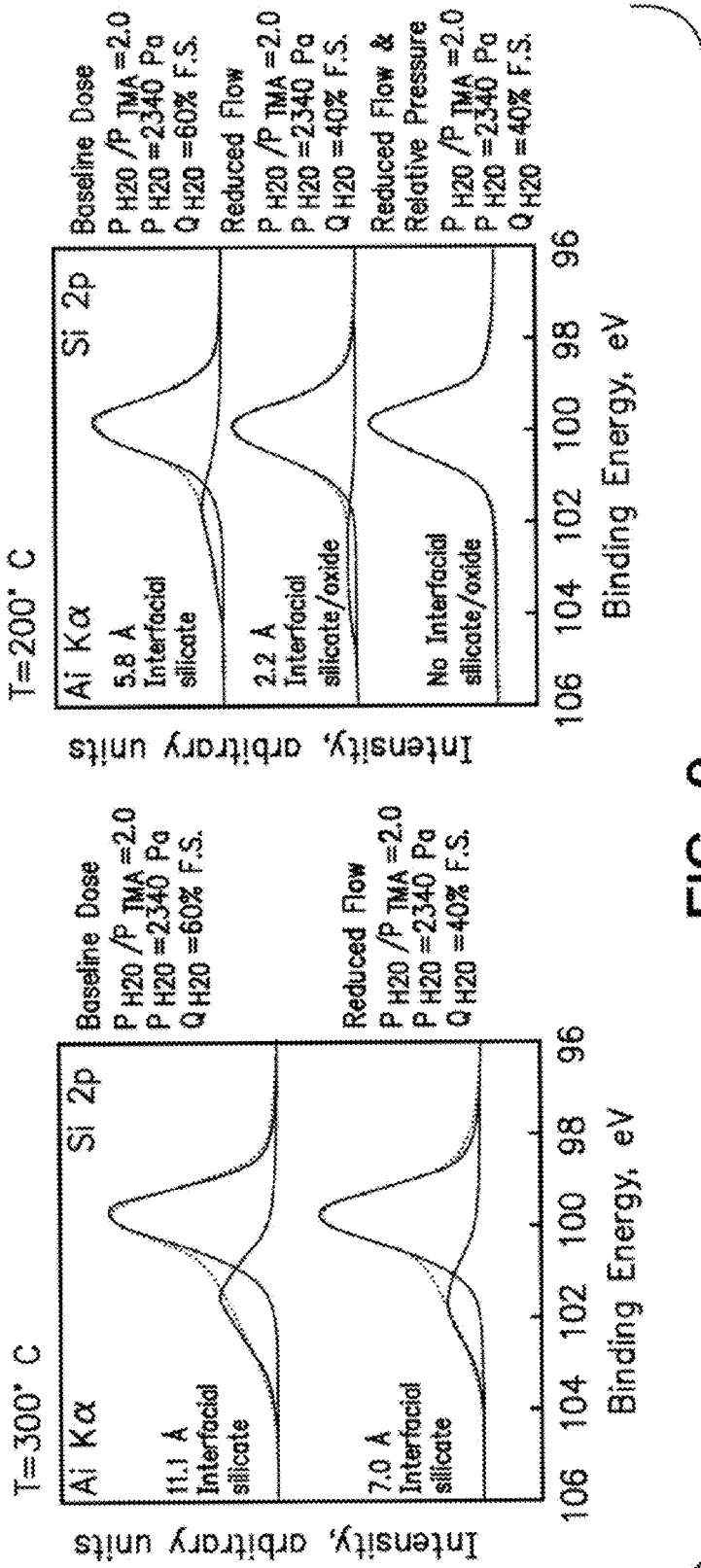
FIG. 9 shows a chart depicting interfacial layers produced in ALD processes at various oxidant temperatures including those set forth in the embodiment of FIG. 7.

Referring to FIG. 9, results of a method for forming a resistive switching element according to FIG. 7 where the second film is aluminum oxide, an ALD device flows tri-methyl aluminum (TMA) and water vapor over a silicon substrate. Reducing the temperature of the water vapor, with a corresponding reduction in deposition temperature, increases a ratio of TMA to water vapor. Similar deposition by conventional methods produces an interfacial layer of about 1.1 nm; the present method can produce a metal oxide layer on a silicon substrate with no interfacial layer, permitting $AlO_x$ to form an abrupt layer with silicon. FIG. 9 shows $AlO_x$ layers produced on silicon substrates at various temperatures.

Figure 10:
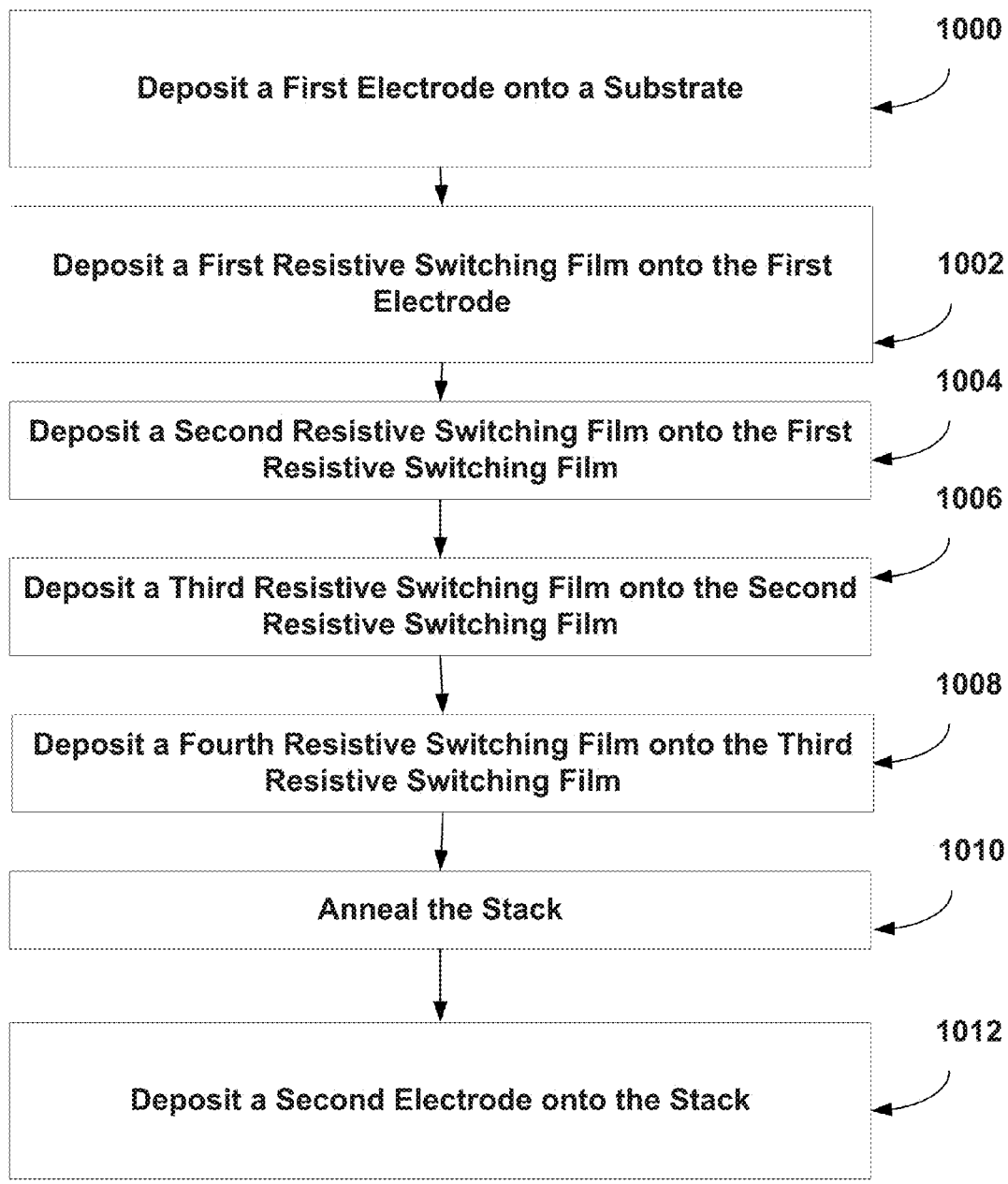
FIG. 10 shows a flowchart depicting another embodiment of a method for producing resistive switching elements.
Figure 11:
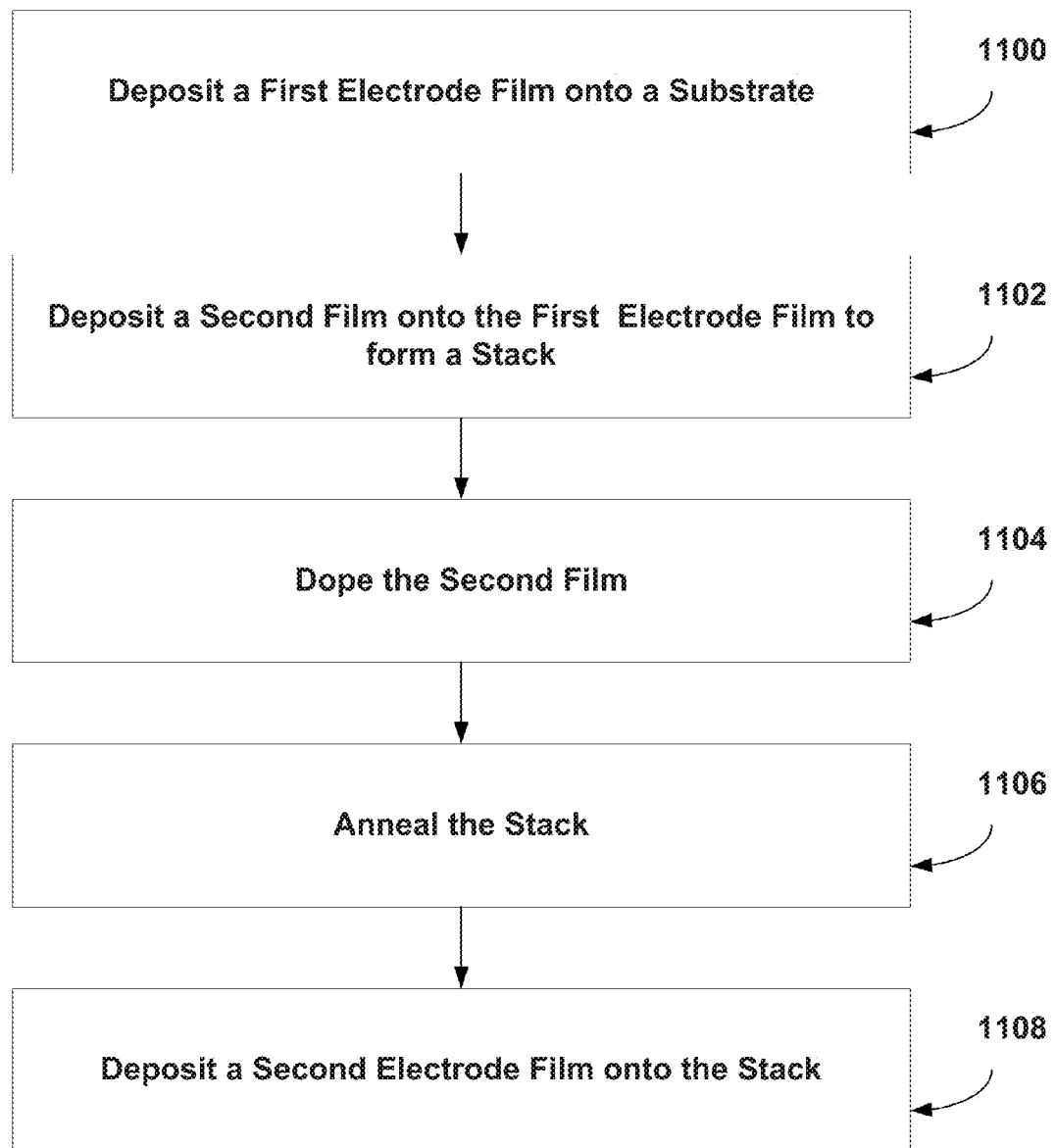
FIG. 11 shows a flowchart depicting another embodiment of a method for producing resistive switching elements.

Reducing Forming Voltage by Modulating Defect Densities as in FIG. 10

During a resistive switching element production process, defects or chemical impurities can form in films deposited by ALD, CVD or PVD. Defects include "electron traps" (defects that capture mobile electrons) and "oxygen vacancies" (oxygen atoms that should appear in an oxide film are absent). These defects affect the resistive switching characteristics of a film. Defect density is one property of the resistive dielectric material in a resistive switching element that affects forming voltage. Specifically, electron traps and oxygen vacancies adjacent to an electrode in a resistive switching element reduce forming voltage by increasing conduction of the dielectric material.

Referring to FIG. 10, another method for forming a resistive switching element is described. A first electrode is deposited during operation 1000 onto a substrate. The first electrode is made from a material suitable for use in a resistive switching element, such as poly-Si. A first resistive switching film is then deposited during operation 1002 onto the first electrode by, e.g., ALD. The first resistive switching film is made from a dielectric material suitable for use in a resistive switching element, such as $HfO_x$. By manipulating the deposition temperature during the ALD process, a manufacturer can manipulate the concentration of unreacted ALD precursor ligands in the resulting film so as to achieve layers having optimal or desired physical characteristics. A subsequent annealing process removes ligand fragments to create electronic defects useful in fostering the formation of conductive pathways.

After deposition of the first resistive switching film, a series of metal oxides with monotonically increasing band gaps is deposited; for example a second resistive switching film of titanium oxide (band gap of 3.5 eV) is deposited during operation 1004 onto the first film, and a third film of zirconium oxide (band gap 5.8 eV) is deposited during operation 1006 onto the second film. A fourth film of aluminum oxide (band gap 8.7 eV) may be deposited during operation 1008 onto the third film. An insulating layer comprising metal oxides with increasing band gap has electrical properties conducive to forming conductive pathways. The stack of these films (e.g., four resistive switching films listed above) may then be annealed during operation 1010. A second electrode is then deposited during operation 1012 onto the fourth film. The second electrode is made from a material suitable for use in a resistive switching element, such as TiN.

Figure 12:
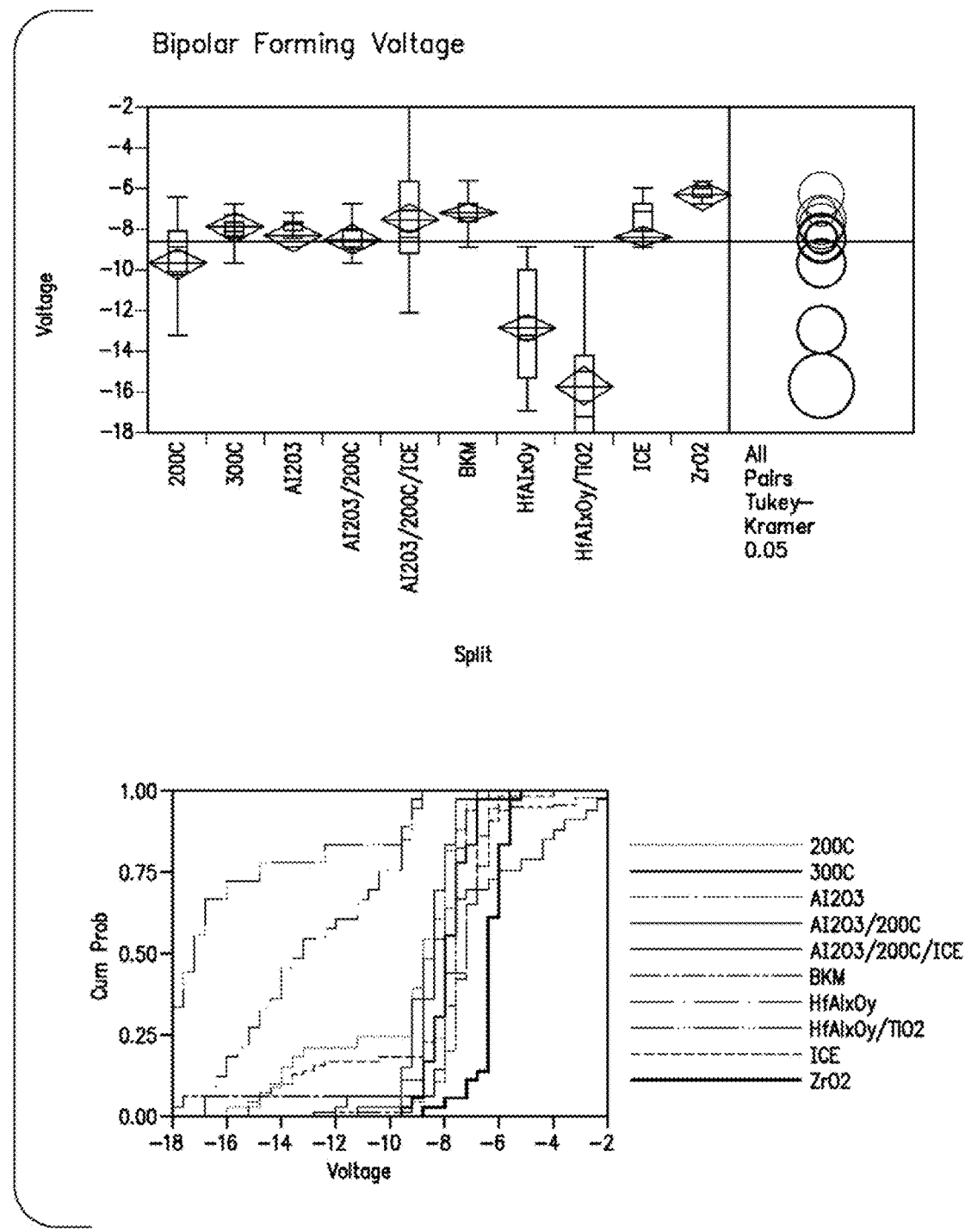
FIG. 12 shows a chart depicting forming voltages of various resistive switching elements formed by the method set forth in FIG. 11.
Figure 13:
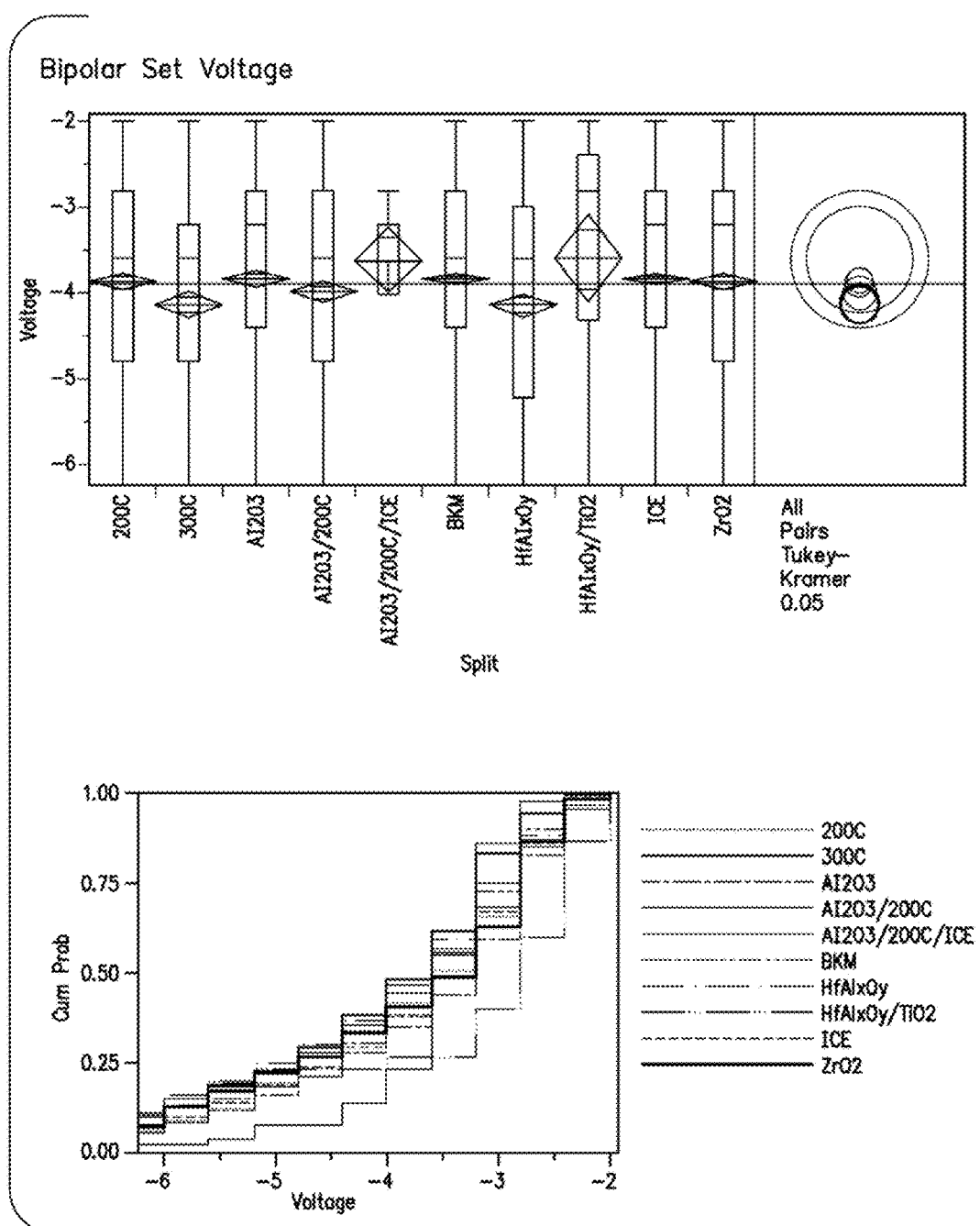
FIG. 13 shows a chart depicting set voltages of various resistive switching elements formed by the method set forth in FIG. 11.
Figure 14:
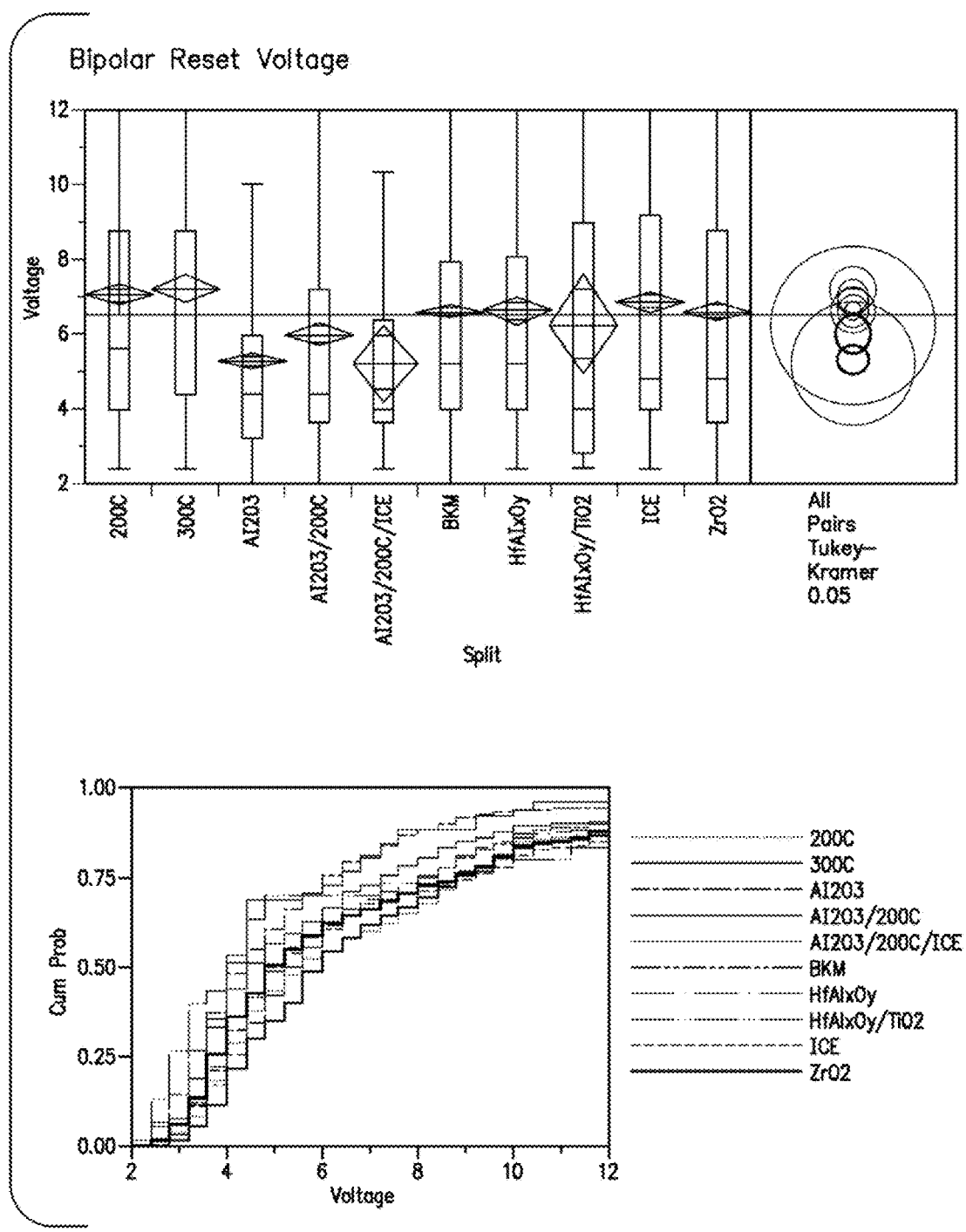
FIG. 14 shows a chart depicting reset voltages of various resistive switching elements formed by the method set forth in FIG. 11.
Figure 15:
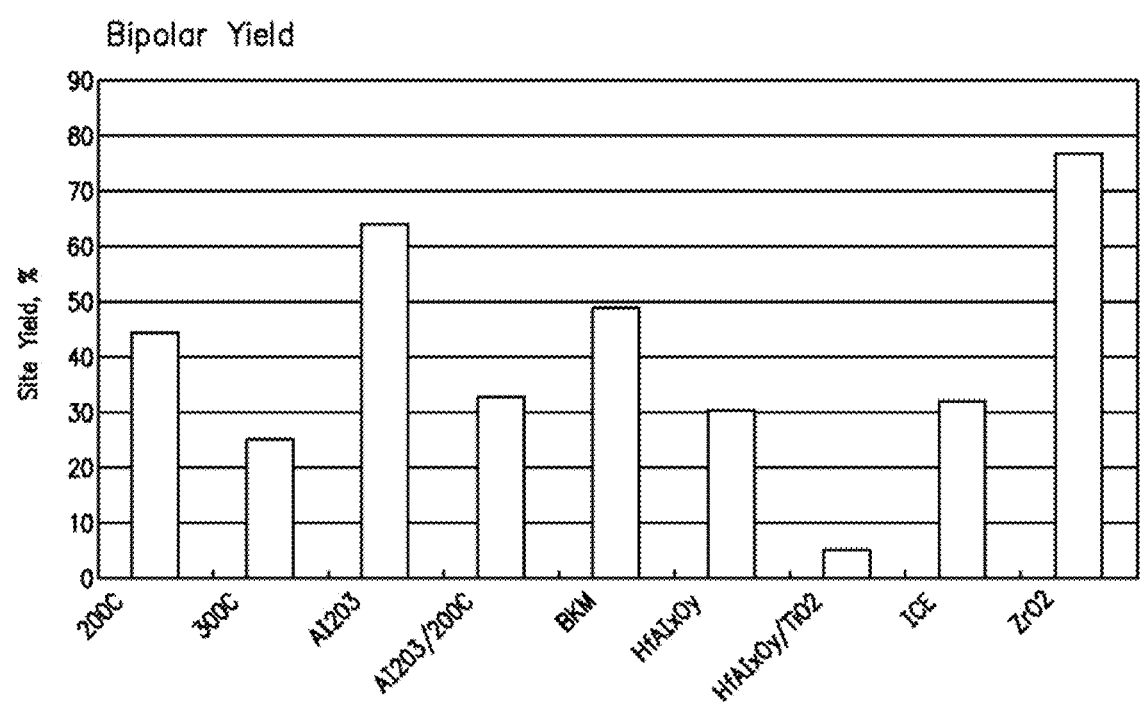
FIG. 15 shows a chart depicting site yields for various resistive switching elements formed by the method set forth in FIG. 11.

FIG. 12, FIG. 13 and FIG. 14 show the performance of resistive switching elements produced by the present methods. FIG. 12 shows the forming voltage of resistive switching elements fabricated by processes known in the art, and by methods described herein. Forming voltage is lower for resistive switching elements fabricated by the methods of the present invention. FIG. 13 shows the set voltage and FIG. 14 shows the reset voltage of resistive switching elements fabricated by processes known in the art, and by methods described herein. FIG. 15 shows site device yield for resistive switching elements produced by the present method.

In some embodiments, a resistive switching film may be made from a tetravalent metal or mix of tetravalent metals. An adjacent resistive switching film may be made from a trivalent metal, or mix of trivalent metals. Doping tetravalent metal oxides with trivalent metal oxides increases electrical defects in the dielectric layer of a resistive switching element, reducing operating voltages including forming voltage.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

The invention claimed is:
1. A method comprising:
   depositing a first electrode material,
      wherein the first electrode material comprises polysilicon;
   depositing a metal over the first electrode material,
      wherein the metal comprises one or more of titanium, nickel, cobalt, palladium, or platinum;

annealing the first electrode material and the metal thereby forming a first electrode comprising a silicide of the one or more of titanium, nickel, cobalt, palladium, or platinum;

depositing a first resistive switching film over the first electrode; wherein the first resistive switching film comprises a first dielectric material configured to develop conductive pathways during application of a predetermined voltage and further configured to maintain said conductive pathways after said predetermined voltage is removed, wherein the first dielectric material comprises oxygen, and wherein the first resistive switching film is deposited at a temperature of less than 200° C.; and depositing a second electrode.

2. The method of claim 1, wherein the first dielectric material comprises hafnium oxide.

3. The method of claim 1, wherein the first resistive switching film is deposited using atomic layer deposition (ALD).

4. The method of claim 1, further comprising depositing a second resistive switching film onto the first resistive switching film prior to depositing the second electrode, wherein the first resistive switching layer and the second resistive switching layer form a stack, the stack being configured to develop conductive pathways during application of a predetermined voltage and further configured to maintain said conductive pathways after said predetermined voltage is removed.

5. The method of claim 4, wherein the second resistive switching film is deposited using atomic layer deposition (ALD).

6. The method of claim 4, wherein the second resistive switching film comprises titanium oxide.

7. The method of claim 6, wherein the first resistive switching film comprises hafnium oxide.

8. The method of claim 7, wherein the second electrode comprises titanium nitride.

9. The method of claim 4, further comprising annealing the stack, wherein during annealing the first dielectric material diffuses into the second resistive switching film.

10. The method of claim 9, wherein the annealing is performed prior to depositing the second electrode.

11. The method of claim 1, wherein the first resistive switching film directly interfaces the first electrode.

12. The method of claim 1, wherein the metal deposited over the first electrode material is formed using physical vapor deposition.

13. The method of claim 1, wherein the first resistive switching film is deposited using tetrakisdimethylaminohafnium (TDMAH), and wherein the TDMAH is maintained at a temperature between 40° C. and 50° C.

14. The method of claim 13, wherein the first resistive switching film is deposited using an oxidizer, and wherein the oxidizer is maintained below room temperature.

15. The method of claim 14, wherein the oxidizer is water.

16. The method of claim 14, wherein the oxidizer is maintained at a temperature of between about 2° C. and 5° C.

* * * * *